US012672304B2

(12) United States Patent
Chang et al.

(10) Patent No.: US 12,672,304 B2
(45) Date of Patent: Jun. 30, 2026

(54) ELECTROSTATIC DISCHARGE PROTECTION DEVICE

(71) Applicant: Vanguard International Semiconductor Corporation, Hsinchu (TW)

(72) Inventors: Ting-Yu Chang, Zhubei City (TW); Jian-Hsing Lee, Hsinchu City (TW); Yeh-Ning Jou, Hsinchu City (TW); Chieh-Yao Chuang, Kaohsiung City (TW); Hsien-Feng Liao, Taichung City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 364 days.

(21) Appl. No.: 18/396,306

(22) Filed: Dec. 26, 2023

(65) Prior Publication Data

US 2025/0212448 A1 Jun. 26, 2025

(51) Int. Cl.
| | |
|---|---|
| *H01L 29/78* | (2006.01) |
| *H01L 29/06* | (2006.01) |
| *H10D 30/60* | (2025.01) |
| *H10D 62/10* | (2025.01) |

(52) U.S. Cl.
CPC ........... *H10D 30/60* (2025.01); *H10D 62/116* (2025.01); *H10D 62/124* (2025.01)

(58) Field of Classification Search
CPC .... H10D 30/60; H10D 62/116; H10D 62/124; H10D 64/111; H10D 89/713; H10D 8/20
USPC ......................................................... 257/288
See application file for complete search history.

(56) References Cited

U.S. PATENT DOCUMENTS

| | | | |
|---|---|---|---|
| 2009/0267154 A1* | 10/2009 | Boselli | H10D 89/711 |
| | | | 257/355 |
| 2025/0098244 A1* | 3/2025 | Chang | H10D 62/106 |

\* cited by examiner

*Primary Examiner* — Tong-Ho Kim
(74) *Attorney, Agent, or Firm* — Birch, Stewart, Kolasch & Birch, LLP

(57) ABSTRACT

An electrostatic discharge protection device is provided. The electrostatic discharge protection device includes an N-type deep well region (DNW), first and second high-voltage P- and N-type well regions (first and second HVPW and HVNW), a low-voltage N-type well region (LVNW), first and second P- and first N-type doped regions in a P-type semiconductor substrate, and a gate structure. The first and second HVPW and HVNW are located on the DNW. The LVNW is located on the first HVPW. The first P- and N-type doped regions and second P-type doped region are located on the LVNW and the second HVNW and HVPW. The first P-type doped region is electrically connected to a first voltage source. The gate structure on the first and second HVPW and the first HVNW, the second P-type doped region and the first N-type doped region are electrically connected to a second voltage source.

19 Claims, 4 Drawing Sheets

ELECTROSTATIC DISCHARGE PROTECTION DEVICE

BACKGROUND OF THE INVENTION

Field of the Invention

The present disclosure relates to an electrostatic discharge protection device, and, in particular, to the structure of an electrostatic discharge protection device.

Description of the Related Art

Electronic device damage caused by electrostatic discharge (ESD) has become one of the most important reliability issues for integrated circuit products. As the size of the integrated circuit products continues to shrink to deep sub-micron levels, the gate oxide layer of metal-oxide-semiconductor field-effect transistors is becoming thinner and thinner. Therefore, the integrated circuits are more susceptible to damage due to the ESD phenomenon. In general industry standards, the input and output pins (I/O pins) of an integrated circuit product must be able to pass ESD testing of both the human-body model (HBM) and the machine model (MM). The required voltage level for the HBM ESD testing is more than 2000 volts, and the required voltage level for MM ESD testing is more than 200 volts. Therefore, ESD components in integrated circuit products need to be arranged close to all of the I/O pads to protect the internal core circuit from ESD currents.

BRIEF SUMMARY OF THE INVENTION

An embodiment of the disclosure provides an electrostatic discharge protection device. The electrostatic discharge protection device includes a P-type semiconductor substrate, an N-type deep well region, a first high-voltage P-type well region, a first high-voltage N-type well region, a first high-voltage N-type well region, a second high-voltage N-type well region, a low-voltage N-type well region, a first P-type doped region, a second P-type doped region, a first N-type doped region and a gate structure. The N-type deep well region is located in the P-type semiconductor substrate. The first high-voltage P-type well region is located on the N-type deep well region. The first high-voltage N-type well region is located on the N-type deep well region. The first high-voltage N-type well region and the first high-voltage P-type well region are arranged side-by-side. The second high-voltage P-type well region is located on the N-type deep well region. The second high-voltage P-type well region and the first high-voltage N-type well region are arranged side-by-side. The second high-voltage N-type well region is located on the N-type deep well region. The second high-voltage N-type well region and the second high-voltage P-type well region are arranged side-by-side. The low-voltage N-type well region is located on the first high-voltage P-type well region. The first P-type doped region is located on the low-voltage N-type well region. The second P-type doped region is located on the second high-voltage P-type well region. The first N-type doped region is located on the second high-voltage N-type well region. The gate structure is disposed on the first high-voltage P-type well region, the first high-voltage N-type well region and the second high-voltage P-type well region. The gate structure is located between the first P-type doped region and the second P-type well region. The first P-type doped region is electrically connected to a first voltage source. The gate structure, the second P-type doped region and the first N-type doped region are electrically connected to a second voltage source.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
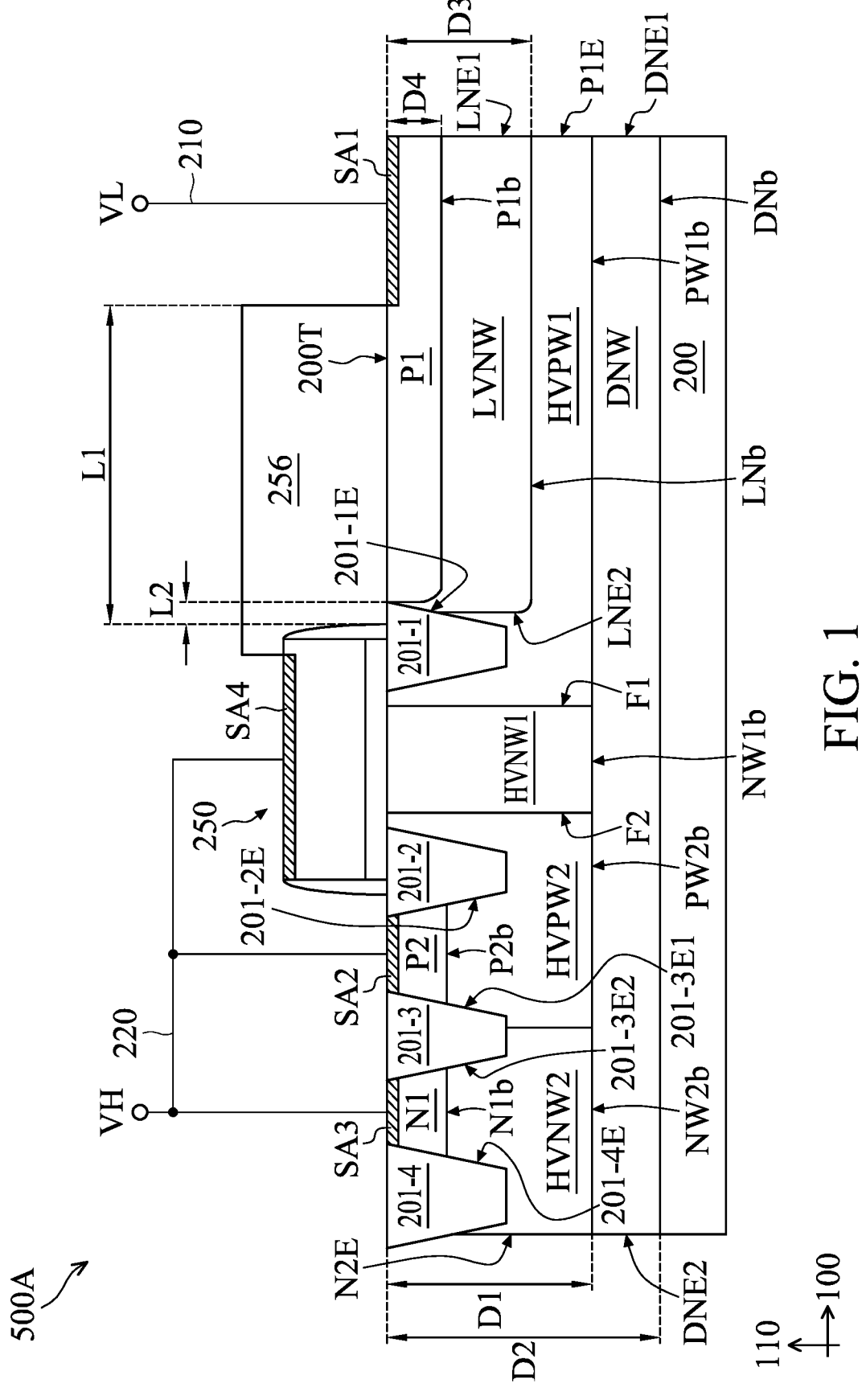
FIG. 1 is a schematic cross-sectional view of an electrostatic discharge protection device in accordance with some embodiments of the disclosure.

FIG. 1 is a schematic cross-sectional view of an electrostatic discharge (ESD) protection device 500A in accordance with some embodiments of the disclosure. The electrostatic discharge protection device 500A is electrically connected between the first voltage source VL and the second voltage source VH of the system to prevent an electrostatic discharge current from flowing through the circuit under protection. The electrostatic discharge protection device 500A includes a P-type semiconductor substrate 200, an N-type deep well region DNW, a first high-voltage P-type well region HVPW1, a second high-voltage P-type well region HVPW2, a first high-voltage N-type well region HVNW1, the second high-voltage N-type well region HVNW2, the low-voltage N-type well region LVNW, the first P-type doped region P1, the second P-type doped region P2 and the first N-type doped region N1 located in the P-type semiconductor substrate 200, and the gate structure 250.

In some embodiments, the P-type semiconductor substrate 200 may be a semiconductor substrate having a conductivity type of P-type. The semiconductor substrate includes an elementary semiconductor, such as silicon (Si), germanium (Ge), etc.; a compound semiconductor, such as gallium nitride (GaN), silicon carbide (SiC), gallium arsenide (GaAs), gallium phosphide (GaP), indium phosphide (InP), indium arsenide (InAs), indium antimonide (InSb), etc.; an alloy semiconductor, such as SiGe alloy, GaAsP alloy, AlInAs alloy, AlGaAs alloy, GaInAs alloy, GaInP alloy, GaInAsP alloy, or a combination thereof. In addition, the P-type semiconductor substrate 200 may also be a P-type silicon-on-insulator (SOI).

As shown in FIG. 1, the N-type deep well region DNW is located in the P-type semiconductor substrate 200. The first high-voltage P-type well region HVPW1, the second high-voltage P-type well region HVPW2, the first high-voltage N-type well region HVNW1, and the second high-voltage N-type well region HVNW2 are all located on the N-type deep well region DNW. In addition, the first high-voltage P-type well region HVPW1, the second high-voltage P-type well region HVPW2, the first high-voltage N-type well region HVNW1, and the second high-voltage N-type well region HVNW2 extend from a top surface 200T of the P-type semiconductor substrate 200 into a portion of the P-type semiconductor substrate 200. The first high-voltage N-type well region HVNW1 and the first high-voltage P-type well region HVPW1 are arranged side-by-side and adjacent to each other along the direction 100 (the lateral direction) substantially parallel to the top surface 200T of the P-type semiconductor substrate 200. The second high-voltage P-type well region HVPW2 and the first high-voltage N-type well region HVNW1 are arranged side-by-side along the direction 100 (the lateral direction) and adjacent to each other. The second high-voltage N-type well region HVNW2 and the second high-voltage P-type well region HVPW2 are arranged side-by-side along the direction 100 (the lateral direction) and adjacent to each other. Moreover, the first high-voltage P-type well region HVPW1 and the second high-voltage P-type well region HVPW2 are respectively located on opposite sides of the first high-voltage N-type well region HVNW1 along the direction 100. The first high-voltage N-type well region HVNW1 and the second high-voltage N-type well region HVNW2 are respectively located on the opposite sides of the second high-voltage P-type well region HVPW2 along the direction 100.

In some embodiments, the first high-voltage P-type well region HVPW1, the second high-voltage P-type well region HVPW2, the first high-voltage N-type well region HVNW1 and the second high-voltage N-type well region HVNW2 have the same depth D1 (i.e., the distance between the top surface 200T of the P-type semiconductor substrate 200 and a bottom surface PW1$b$ of the first high-voltage P-type well region HVPW1, the distance between the top surface 200T and a bottom surface PW2$b$ of the second high-voltage P-type well region HVPW2, the distance between the top surface 200T and a bottom surface NW1$b$ of the first high-voltage N-type well region HVNW1, or the distance between the top surface 200T and a bottom surface NW2$b$ of the second high-voltage N-type well region HVNW2) along a direction 110 (i.e., a direction substantially perpendicular to the top surface 200T of the P-type semiconductor substrate 200). The depth D2 (i.e., the distance between a bottom surface DNb of the N-type deep well region DNW and the top surface 200T of the P-type semiconductor substrate 200) of the N-type deep well region DNW along the direction 110 is greater than the depth D1 of the first high-voltage P-type well region HVPW1, the second high-voltage P-type well region HVPW2, the first high-voltage N-type well region HVNW1 and the second high-voltage N-type well region HVNW2. Moreover, the N-type deep well region DNW is in contact with the bottom surface PW1$b$ of the first high-voltage P-type well region HVPW1, the bottom surface PW2$b$ of the second high-voltage P-type well region HVPW2, the bottom surface NW1$b$ of the first high-voltage N-type well region HVNW1 and the bottom surface NW2$b$ of the second high-voltage N-type well region HVNW2. Therefore, the first high-voltage N-type well region HVNW1 and the second high-voltage N-type well region HVNW2 are electrically connected to each other by the N-type deep well region DNW. In the cross-sectional view shown in FIG. 1, a boundary DNE1 of the N-type deep well region DNW is aligned with a boundary PIE of the first high-voltage P-type well region HVPW1. In addition, a boundary DNE2 of the N-type deep well region DNW is aligned with a boundary N2E of the second high-voltage N-type well region HVNW2. In some embodiments, the first high-voltage P-type well region HVPW1 and the second high-voltage P-type well region HVPW2 have the same dopant concentration, which is greater than that of the P-type semiconductor substrate 200. Furthermore, the first high-voltage N-type well region HVNW1 and the second high-voltage N-type well region HVNW2 may have the same dopant concentration, which is greater than or equal to that of the N-type deep well region DNW.

As shown in FIG. 1, the low-voltage N-type well region LVNW of the electrostatic discharge protection device 500A is located on the first high-voltage P-type well region HVPW1 and extends along the direction 100 to above the boundary PIE of the first high-voltage P-type well region HVPW1. In this embodiment, a side surface LNE1 of the low-voltage N-type well region LVNW away from the first high-voltage N-type well region HVNW1 is aligned with the boundary PIE of the first high-voltage P-type well region HVPW1 away from the first high-voltage N-type well region HVNW1. Moreover, a bottom surface LNb of the low-voltage N-type well region LVNW is located on the bottom surface PW1$b$ of the first high-voltage P-type well region HVPW1. A depth D3 (i.e., the distance between the bottom surface LNb of the low-voltage N-type well region LVNW and the top surface 200T of the P-type semiconductor substrate 200) of the low-voltage N-type well region LVNW along the direction 110 is smaller than the depth D1 of the first high-voltage N-type well region HVNW1.

As shown in FIG. 1, the first P-type doped region P1, the second P-type doped region P2 and the first N-type doped region N1 of the electrostatic discharge protection device 500A are respectively located on the low-voltage N-type well region LVNW, the second high-voltage P-type well region HVPW2 and the second high-voltage N-type well region HVNW2. In addition, the first P-type doped region P1, the second P-type doped region P2 and the first N-type doped region N1 extend from the top surface 200T of the P-type semiconductor substrate 200 into a portion of the P-type semiconductor substrate 200. In this embodiment, the low-voltage N-type well region LVNW completely overlaps the first P-type doped region P1 along the direction 110. A bottom surface P1$b$ of the first P-type doped region P1 may separate from the first high-voltage P-type well region HVPW1 by the low-voltage N-type well region LVNW.

In some embodiments, the first P-type doped region P1, the second P-type doped region P2 and the first N-type doped region N1 have the same depth D4 (i.e., the distance between the top surface 200T of the P-type semiconductor substrate 200 and the bottom surface P1$b$ of the first P-type doped region P1, the distance between the top surface 200T and a bottom surface P2$b$ of the second P-type doped region P2, or the distance between the top surface 200T and a bottom surface N1$b$ of the first N-type doped region N1) in the direction 110 (i.e., the direction substantially perpendicular to the top surface 200T of the P-type semiconductor substrate 200). Further, the depth D4 is smaller than the depth D1 of the first high-voltage P-type well region HVPW1, the second high-voltage P-type well region HVPW2, the first high-voltage N-type well region HVNW1 and the second high-voltage N-type well region HVNW2. Moreover, the depth D4 is smaller than the depth is D3 of the low-voltage N-type well region LVNW. As shown in FIG. 1, the bottom surface P2$b$ of the second P-type doped region P2 may be adjacent to the second high-voltage P-type well region HVPW2. The bottom surface N1$b$ of the first N-type doped region N1 may be adjacent to the second high-voltage N-type well region HVNW2. In some embodiments, the first P-type doped region P1, the second P-type doped region P2 and the first N-type doped region N1 may be respectively serve as the P-type heavily doped region P1, the P-type heavily doped region P2 and the N-type heavily doped region N1. The first P-type doped region P1 and the second P-type doped region P2 may have the same dopant concentration which is greater than the dopant concentrations of the first high-voltage P-type well region HVPW1 and the second high-voltage P-type well region HVPW2. In addition, the first P-type doped region P1 and the second P-type doped region P2 may respectively serve as the pick-up doped regions of the first high-voltage P-type well region HVPW1 and the second high-voltage P-type well region HVPW2. The dopant concentration of the first N-type doped region N1 may be greater than the dopant concentrations of the first high-voltage N-type well region HVNW1 and the second high-voltage N-type well region HVNW2. Therefore, the first N-type doped region N1 may serve as the pick-up doped region of the first high-voltage N-type well region HVNW1, the second high-voltage N-type well region HVNW2 and the N-type deep well region DNW.

In some embodiments, P-type dopants and N-type dopants may be separately implanted in the P-type semiconductor substrate 200 to form the N-type deep well region DNW and the first high-voltage P-type well region HVPW1, the second high-voltage P-type well region HVPW2, the first high-voltage N-type well region HVNW1, the second high-voltage N-type well region HVNW2, the low-voltage N-type well region LVNW, the first P-type doped region P1, the second P-type doped region P2 and the first N-type doped region N1 by multiple ion implantation processes. In some embodiments, the N-type dopant may include phosphorus (P), arsenic (As), nitrogen ($N_2$), antimony (Sb), or a combination thereof. In some embodiments, the P-type dopant may include boron (B), gallium (Ga), aluminum (Al), indium (In), boron trifluoride ions ($BF_3^+$), or a combination thereof. In some embodiments, the first high-voltage P-type well region HVPW1 and the second high-voltage P-type well region HVPW2 may be formed by the same ion implantation process or separated ion implantation processes. In some embodiments, the first high-voltage N-type well region HVNW1 and the second high-voltage N-type well region HVNW2 may be formed by the same ion implantation process or separated ion implantation processes. In some embodiments, the first P-type doped region P1 and the second P-type doped region P2 may be formed by the same ion implantation process or separated ion implantation processes.

The electrostatic discharge protection device 500A also includes isolation features 201-1, 201-2, 201-3, and 201-4. The isolation features 201-1, 201-2, 201-3, and 201-4 are formed from the top surface 200T of the P-type semiconductor substrate 200 and extend into a portion of the P-type semiconductor substrate 200. More specifically, the isolation feature 201-1 may be disposed in a portion of the first high-voltage P-type well region HVPW1 and close to an interface F1 between the first high-voltage P-type well region HVPW1 and the first high-voltage N-type well region HVNW1. A side surface 201-1E of the isolation feature 201-1 away from the interface F1 may be adjacent to the low-voltage N-type well region LVNW and the first P-type doped region P1. The low-voltage N-well region LVNW may extend from a side surface 201-1E of the isolation feature 201-1 away from the interface F1 to above the boundary PIE of the first high-voltage P-well region HVPW1 along the direction 100. The isolation feature 201-2 may be disposed in the second high-voltage P-type well region HVPW2 and close to an interface F2 between the second high-voltage P-type well region HVPW2 and the first high-voltage N-type well region HVNW1. A side surface 201-2E of the isolation feature 201-2 away from the interface F2 is adjacent to the second P-type doped region P2. As shown in FIG. 1, the first high-voltage N-type well region HVNW1 is located between and separated from the isolation features 201-1 and 201-2 along the direction 100. Furthermore, the first P-type doped region P1 and the second P-type doped region P2 may be spaced apart from each other by the isolation features 201-1 and 201-2. The isolation feature 201-3 may be disposed between the second high-voltage P-type well region HVPW2 and the second high-voltage N-type well region HVNW2. As shown in FIG. 1, opposite side surfaces 201-3E1 and 201-3E2 of the isolation feature 201-3 are respectively adjacent to the second P-type doped region P2 and the first N-type doped region N1. The second P-type doped region P2 and the first N-type doped region N1 may be spaced apart from each other by the isolation feature 201-3. The isolation feature 201-4 may be disposed close to the boundary N2E of the second high-voltage N-well region HVNW2. As shown in FIG. 1, a side surface 201-4E of the isolation feature 201-4 close to the isolation feature 201-3 may be adjacent to the first N-type doped region N1. The first N-type doped region N1 and other heavily doped regions (not shown) may be spaced apart from each other by the isolation feature 201-4.

In some embodiments, the isolation features 201-1, 201-2, 201-3, and 201-4 include field oxide (FOX) layers formed by a local oxidation of silicon (LOCOS) process, shallow trench isolation (STI) structures formed by a deposition process, or another suitable isolation structure. In some embodiments, the isolation features 201-1, 201-2, 201-3, and 201-4 are formed by a thermal oxidation process, including a dry oxidation process, a wet oxidation process, or another suitable thermal oxidation process.

As shown in FIG. 1, the gate structure 250 is disposed on the first high-voltage P-type well region HVPW1, the first high-voltage N-type well region HVNW1 and the second high-voltage P-type well region HVPW2. In addition, the gate structure 250 is located between the first P-type doped region P1 and the second P-type doped region P2 along the direction 100 (the lateral direction). Furthermore, the gate structure 250 may cover a portion of the isolation feature 201-1 and a portion of the isolation feature 201-2. In other words, the gate structure 250 may be located directly above the first high-voltage N-type well region HVNW1 and extend from the first high-voltage N-type well region HVNW1 to cover a portion of the first high-voltage P-type well region HVPW1, a portion of the second high-voltage P-type well region HVPW2, a portion of the isolation feature 201-1 and a portion of the isolation feature 201-2 along the direction 100 (the lateral direction). In some embodiments, the gate structure 250 includes a gate dielectric layer (not shown) disposed on the P-type semiconductor substrate 200, a gate electrode layer (not shown) disposed above the gate dielectric layer, and gate spacers (not shown) disposed on side surfaces of the gate dielectric layer and the gate electrode layer.

In some embodiments, the gate dielectric layer includes silicon oxide, silicon nitride, silicon oxynitride, high-k dielectric material, another suitable dielectric material, or a combination thereof. Examples of high-k dielectric material include $HfO_2$, HfSiO, HfSiON, HfTaO, HfTiO, HfZrO, zirconium oxide, aluminum oxide, hafnium dioxide-alumina (HfO$_2$—Al$_2$O$_3$) alloy, and/or dielectric or similar materials. In some embodiments, an oxidation process, a deposition process, or another suitable process may be used to form a gate dielectric material layer (not shown) on the P-type semiconductor substrate 200. In some embodiments, the gate electrode layer includes polysilicon, amorphous silicon, metal (such as tungsten, titanium, aluminum, copper, molybdenum, nickel, platinum, another suitable metal, or a combination thereof), metal alloys, metal nitrides (such as tungsten nitride, molybdenum nitride, titanium nitride, tantalum nitride, another suitable metal nitride, or a combination thereof), metal oxides (such as ruthenium oxide, indium tin oxide, another suitable metal oxide, or a combination thereof), another suitable material, or a combination thereof. In some embodiments, the gate electrode layer may be implanted with dopants by in-situ doping. In some embodiments, the gate spacer includes silicon oxide, silicon nitride, silicon oxynitride, low-k dielectric material, another suitable dielectric material, or a combination thereof. In some embodiments, the gate spacers may be formed on the side surfaces of the gate dielectric layer and the gate electrode layer by an oxidation process, a deposition process, or another suitable process.

The electrostatic discharge protection device 500A further includes a silicide block layer 256. The silicide block layer 256 is disposed on the P-type semiconductor substrate 200. The silicide block layer 256 covers a portion of the first P-type doped region P1 close to the gate structure 250. In addition, the silicide block layer 256 extends to cover the isolation feature 201-1 exposed from the gate structure 250 and a portion of the gate structure 250. In some embodiments, the silicide block layer 256 may be resist protective oxide (RPO). The silicide block layer 256 is used to block silicide forbidden regions, to prevent subsequence silicide to be formed thereon by the silicide process, so as to maintain the electrical performances of the silicide forbidden regions and to increase the resistance value of the surface of the P-type semiconductor substrate 200. In some embodiments, the silicide block layer 256 may be formed using a chemical vapor deposition (CVD) process or another suitable process. In some embodiments, the material of the silicide block layer 256 may include silicon dioxide, silicon nitride, silicon oxynitride, or another suitable dielectric material.

The electrostatic discharge protection device 500A further includes silicide features SA1, SA2, SA3, and SA4 formed on the top surface 200T of the P-type semiconductor substrate 200 and the gate electrode layer of the gate structure 250. More specifically, the silicide feature SA1 covers the portion of the first P-type doped region P1 that is not covered by the silicide block layer 256. Moreover, the silicide feature SA1 covers a portion of the low-voltage N-type well region LVNW in the direction 110. As shown in FIG. 1, in the direction 100, a distance L1 between the silicide feature SA1 and the gate structure 250 may be greater than a distance L2 between the first P-type doped region P1 and the gate structure 250. In some embodiments, the silicone feature SA1 is separated from the side surface 201-1E of the isolation feature 201-1 away from the interface F1. As shown in FIG. 1, in the direction 110, the silicide feature SA2 may completely cover the second P-type doped region P2. In addition, the silicide feature SA3 may completely cover the first N-type doped region N1. Moreover, the silicide feature SA4 may cover the portion of the gate electrode layer of the gate structure 250 that is exposed from the silicide block layer 256.

In some embodiments, the silicide features SA1, SA2, SA3, and SA4 include metal silicides (such as tungsten silicide, titanium silicide, cobalt silicide, nickel silicide, platinum silicide, erbium silicide, another suitable metal silicide, or a combination thereof). In some embodiments, a metal layer is entirely deposited by chemical vapor deposition (CVD) (such as low pressure vapor deposition (LPCVD) or plasma enhanced chemical vapor deposition (PECVD)), physical vapor deposition (PVD) (such as resistive heating evaporation, electron beam evaporation, or sputtering), electroplating, atomic layer deposition (ALD), another suitable process, or a combination thereof. Then, an annealing process is performed, so that the metal layer on a portion of the first P-type doped region P1, the second P-type doped region P2, the first N-type doped region N1 and a portion of the gate electrode layer of the gate structure 250 and not covered by the silicide block layer 256 may react with the underlying semiconductor material to form the silicide features SA1, SA2, SA3, and SA4. Afterwards, the unreacted metal layer is removed.

The electrostatic discharge protection device 500A further includes conductive lines 210 and 220. The conductive line 210 may be electrically connected to the first P-type doped region P1 by the silicide feature SA1. The conductive line 220 may be electrically connected to the second P-type doped region P2, the first N-type doped region N1 and the gate structure 250 by the silicide features SA2, SA3, and SA4. In some embodiments, the conductive line 210 is coupled to the first voltage source VL. The conductive line 220 is coupled to the second voltage source VH. Therefore, the first P-type doped region P1 is electrically connected to the first voltage source VL by the silicide feature SA1 and the conductive line 210. The second P-type doped region P2, the first N-type doped region N1 and the gate structure 250 are electrically connected to the second voltage source VH by the silicide features SA2, SA3, SA4 and the conductive line 220. In normal operation condition (no electrostatic discharge event occurs), the first voltage source VL may receive a low-level operating voltage (e.g., the ground voltage (GND)), and the second voltage source VH may receive a high-level operating voltage.

On the other hand, the N-type deep well region DNW, the first high-voltage P-type well region HVPW1, the second high-voltage P-type well region HVPW2, the first high-voltage N-type well region HVNW1, and the second high-voltage N-type well region HVNW2, the first P-type doped region P1, the second P-type doped region P2, the first N-type doped region N1 formed in the P-type semiconductor substrate 200 and the gate structure 250 formed on the P-type semiconductor substrate 200 may collectively form a P-type metal-oxide-semiconductor field-effect transistor (PMOS FET) structure. In the P-type metal-oxide-semiconductor field-effect transistor structure, the gate structure 250 serves as the gate of the P-type metal-oxide-semiconductor field-effect transistor structure. The first P-type doped region P1 and the first high-voltage P-type well region HVPW1 serve as the drain of the P-type metal-oxide-semiconductor field-effect transistor structure. The second P-type doped region P2 and the second high-voltage P-type well region HVPW2 serve as the source of the P-type metal-oxide-semiconductor field-effect transistor structure. The first high-voltage N-type well region HVNW1, the second high-voltage N-type well region HVNW2 and the N-type deep well region DNW serve as the base (also called bulk) of the P-type metal-oxide-semiconductor field-effect transistor structure. Furthermore, the low-voltage N-type well region LVNW may be located in the drain region of the P-type metal-oxide-semiconductor field-effect transistor structure and interposed between the first P-type doped region P1 and the first high-voltage P-type well region HVPW1. Therefore, the electrostatic discharge protection device 500A may be composed of a P-type metal-oxide-semiconductor field-effect transistor structure and the low-voltage N-well region LVNW located in the drain region of the P-type metal-oxide-semiconductor field-effect transistor structure. The drain (the first P-type doped region P1 and the first high-voltage P-type well region HVPW1) of the P-type metal-oxide-semiconductor field-effect transistor structure is coupled to the first voltage source VL by the conductive line 210. The gate (the gate structure 250), the source (the second P-type doped region P2 and the second high-voltage P-type well region HVPW2) and the base (the first high-voltage N-type well region HVNW1, the second high-voltage N-type well region HVNW2, and the N-type deep well region DNW) are coupled to the second voltage source VH by the conductive line 220.

Figure 2:
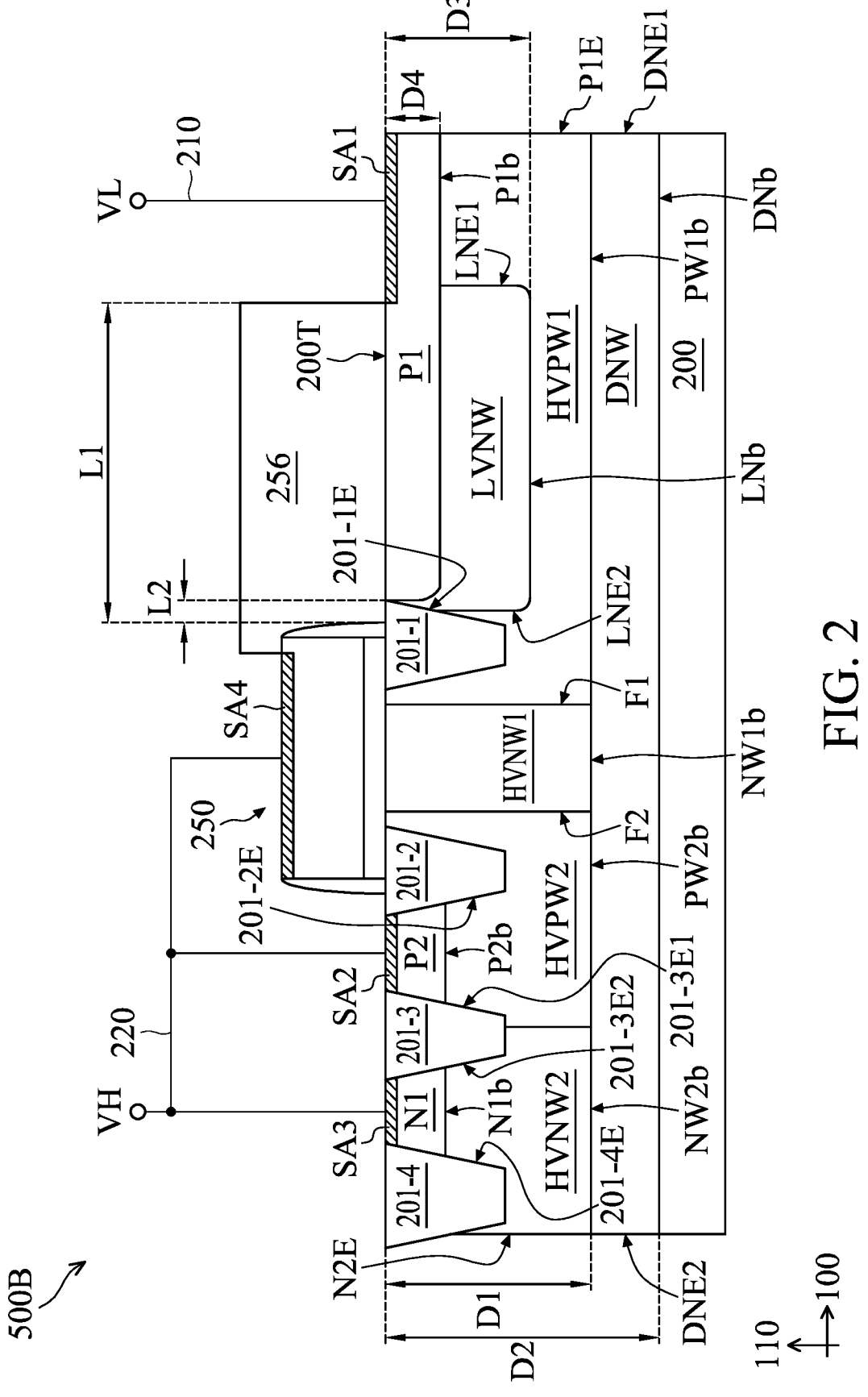
FIG. 2 is a schematic cross-sectional view of an electrostatic discharge protection device in accordance with some embodiments of the disclosure.

FIG. 2 is a schematic cross-sectional view of an electrostatic discharge protection device 500B in accordance with some embodiments of the disclosure. One of the differences between the electrostatic discharge protection devices 500A shown in FIG. 1 and the electrostatic discharge protection device 500B shown in FIG. 2 is that the low voltage N-type well region LVNW of the electrostatic discharge protection device 500B shown in FIG. 2 is located on the first high-voltage P-type well region HVPW1 and partially overlaps the first P-type doped region P1 along the direction 110. In this embodiment, the bottom surface LNb and the opposite side surfaces LNE1 and LNE2 of the low-voltage N-type well region LVNW are adjacent to the first high-voltage P-type well region HVPW1. In other words, the first high-voltage P-type well region HVPW1 of the electrostatic discharge protection device 500B surrounds the opposite side surfaces LNE1 and LNE2 of the low-voltage N-type well region LVNW. In addition, the first high-voltage P-type well region HVPW1 of the electrostatic discharge protection device 500B is simultaneously connected to the first P-type doped region P1 and the low-voltage N-type well region LVNW and the first high-voltage N-type well region HVNW1. In this embodiment, the bottom surface P1b of the first P-type doped region P1 may be adjacent to both the low-voltage N-type well region LVNW and the first high-voltage P-type well region HVPW1. More specifically, the low-voltage N-type well region LVNW and the first high-voltage P-type well region HVPW1 are respectively in contact with different portions of the bottom surface P1b of the first P-type doped region P1.

Figure 3:
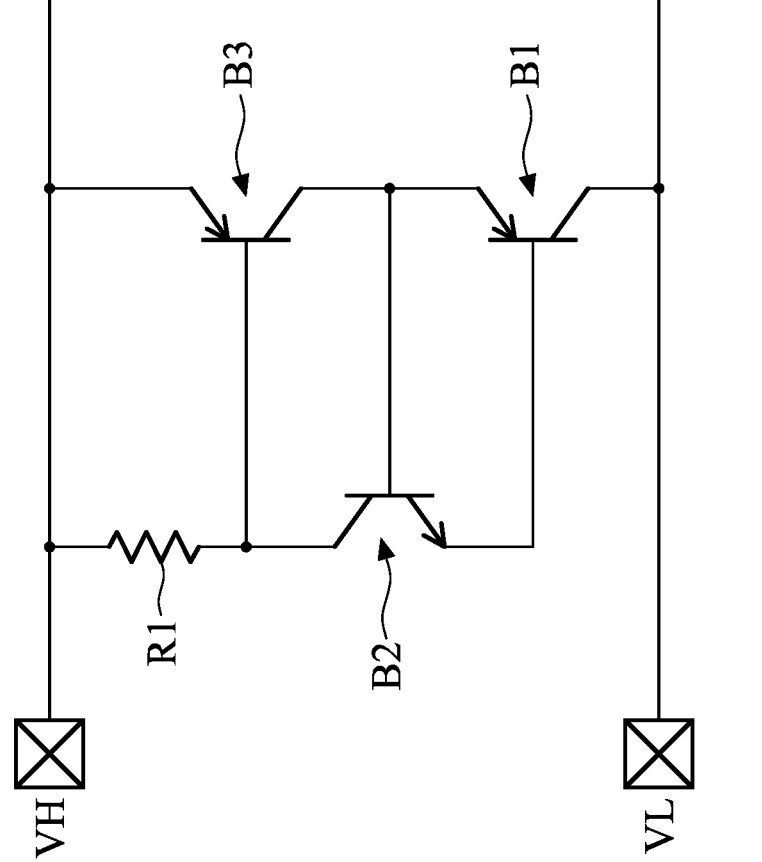
FIG. 3 is an equivalent discharge circuit diagram of the electrostatic discharge protection device in accordance with some embodiments of the disclosure shown in FIGS. 1 and 2, which shows the equivalent discharge circuit when an electrostatic discharge event occurs between the first voltage source and the second voltage source.
Figure 4:
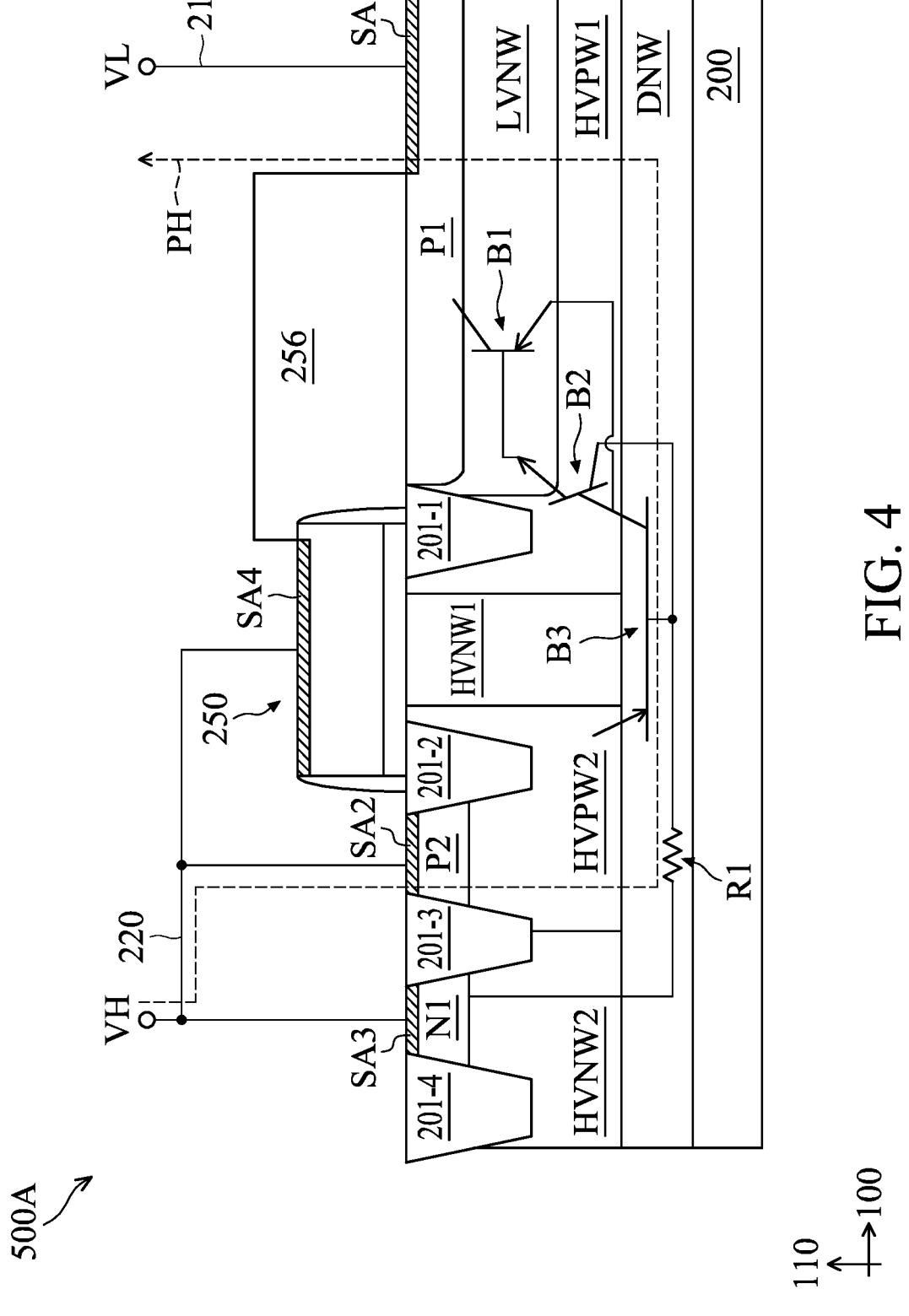
FIG. 4 is a schematic cross-sectional view showing the parasitic elements of the equivalent discharge circuit of FIG. 3 at the corresponding positions of the electrostatic discharge protection device of FIG. 1.

FIG. 3 is an equivalent discharge circuit diagram of the electrostatic discharge protection devices 500A and 500B shown in FIGS. 1 and 2 in accordance with some embodiments of the disclosure, which shows the equivalent discharge circuit when an electrostatic discharge event occurs between the first voltage source VL and the second voltage source VH. FIG. 4 is a schematic cross-sectional view showing the parasitic elements of the equivalent discharge circuit of FIG. 3 at the corresponding positions of the electrostatic discharge protection device 500A of FIG. 1. As shown in FIGS. 3 and 4, the equivalent discharge circuit in a condition that the electrostatic discharge event occurs between the first voltage source VL and the second voltage source VH includes a first parasitic bipolar junction transistor (BJT) B1 (for example, a parasitic PNP BJT) formed by the first high-voltage P-type well region HVPW1, the low-voltage N-type well region LVNW and the first P-type doped region P1. Emitter, base and collector of the first parasitic bipolar junction transistor B1 are respectively formed by the first high-voltage P-type well region HVPW1, the low-voltage N-type well region LVNW and the first P-type doped region P1. The equivalent discharge circuit further includes a second parasitic bipolar junction transistor B2 (for example, a parasitic NPN BJT) formed by the low-voltage N-well region LVNW, the first high-voltage P-well region HVPW1 and the N-type deep well region DNW. Emitter, base and collector of the second parasitic bipolar junction transistor B2 are respectively formed by the low-voltage N-type well region LVNW, the first high-voltage P-type well region HVPW1 and the N-type deep well region DNW. The equivalent discharge circuit further includes a third parasitic bipolar junction transistor B3 (for example, a parasitic PNP BJT) formed by the second high-voltage P-type well region HVPW2, the N-type deep well region DNW, and the first high-voltage P-type well region HVPW1. Emitter, base and collector of the third parasitic bipolar junction transistor B3 are respectively formed by the second high-voltage P-type well region HVPW2, the N-type deep well region DNW and the first high-voltage P-type well region HVPW1. As shown in FIGS. 3 and 4, there is a resistor R1 between the emitter (the second high-voltage P-type well region HVPW2) and the base (the N-type deep well region DNW) of the third parasitic bipolar junction transistor B3. In some embodiments, the resistor R1 is the equivalent resistance of the N-type deep well region DNW and the second high-voltage N-type well region HVNW2.

As shown in FIGS. 3 and 4, the collector (the first P-type doped region P1) of the first parasitic bipolar junction transistor B1 is electrically connected to the first voltage source VL by a conductive line (such as the conductive line 210 in FIG. 1). The base (the low-voltage N-well region LVNW) of the first parasitic bipolar junction transistor B1 is electrically connected to the emitter (the low-voltage N-well region LVNW) of the second parasitic bipolar junction transistor B2. The emitter (the first high-voltage P-type well region HVPW1) of the first parasitic bipolar junction transistor B1 is electrically connected to the base (the first high-voltage P-type well region HVPW1) of the second parasitic bipolar junction transistor B2. The base (the first high-voltage P-well region HVPW1) of the second parasitic bipolar junction transistor B2 is electrically connected to the collector (the first high-voltage P-well region HVPW1) of the third parasitic bipolar junction transistor B3. The collector (the N-type deep well region DNW) of the second parasitic bipolar junction transistor B2 is electrically connected to the base the (N-type deep well region DNW) of the third parasitic bipolar junction transistor B3. The emitter (the second high-voltage P-type well region HVPW2) of the third parasitic bipolar junction transistor B3 and the base (the N-type deep well region DNW) of the third parasitic bipolar junction transistor B3 are electrically connected to the second voltage source VH by a conductive line (such as the conductive line 220 in FIG. 1).

When an electrostatic discharge event occurs at the second voltage source VH and the first voltage source VL is grounded, the emitter (the second high-voltage P-type well region HVPW2) of the third parasitic bipolar junction transistor B3 (for example, a parasitic PNP BJT)) may receive a high voltage level and apply a forward bias to the emitter (the second high-voltage P-type well region HVPW2)-base (the N-type deep well region DNW) junction of the third parasitic bipolar junction transistor B3. Therefore, the third parasitic bipolar junction transistor B3 is triggered to ON. At this time, the base (the first high-voltage P-well region HVPW1) of the second parasitic bipolar junction transistor B2 and the emitter (the high-voltage P-type well region HVPW1) of the first parasitic bipolar junction transistor B1 may receive a high voltage level and apply a forward bias to the base (the first high-voltage P-type well region HVPW1)-emitter (the low-voltage N-type well region LVNW) junction of the second parasitic bipolar junction transistor B2 and the emitter (the first high voltage P-type well region HVPW1)-base (the low voltage N-type well region LVNW) junction of the first parasitic bipolar junction transistor B1. Therefore, the first parasitic bipolar junction transistor B1 and the second parasitic bipolar junction transistor B2 are triggered to ON simultaneously to form a current path PH from the second voltage source VH, through the third parasitic bipolar junction transistor B3, the second parasitic bipolar junction transistor B2, and the first parasitic bipolar junction transistor B1, and to the first voltage source VL to discharge the electrostatic charges away from the circuit under protection.

As shown in FIG. 4, in some embodiments, the second high-voltage P-type well region HVPW2, the N-type deep well region DNW (may further includes the first high-voltage N-type well region HVNW1), the first high-voltage P-type well region HVPW1, the low voltage N-type well region LVNW and the first P-type doped region P1 of the electrostatic discharge protection device 500A form a P-N-P-N-P junction. When an electrostatic discharge event occurs at the second voltage source VH and the first voltage source VL is grounded, the electrostatic charges may flow from the second voltage source VH, through the current path PH formed by the P-N-P-N-P junction, and finally to the first voltage source VL. Therefore, the electrostatic charges may be discharged away from the circuit under protection. Compared with the conventional electrostatic discharge protection device formed of the PNP parasitic bipolar junction transistor or the parasitic silicon controlled rectifier (SCR) formed in P-type metal-oxide-semiconductor field-effect transistor (PMOS FET), the trigger voltage $(V_{t1})$ of the electrostatic discharge protection device in accordance with some embodiments of the disclosure is lower than that of the conventional PNP parasitic bipolar junction transistor. The electrostatic discharge protection device 500A in accordance with some embodiments of the disclosure has advantages of non-snapback characteristic and low holding voltage $(V_{Hold})$, etc. Moreover, the on resistance $(R_{on})$ of the electrostatic discharge protection device 500A is greater than the on resistance of the conventional parasitic silicon controlled rectifier. When the protected component is in normal operation, the electrostatic discharge protection device 500A is not easily triggered to ON, and has the function of preventing latch-up occurring.

In some embodiments, the equivalent circuit discharge diagram and the current discharge path between the different terminals of the electrostatic discharge protection device 500B and the parasitic elements of the equivalent discharge circuit at the corresponding positions of the electrostatic discharge protection device 500B shown in FIG. 2 triggered by the aforementioned ESD events are the same as those of the ESD protection device 500A. In addition, the ESD protection devices 500A and 500B have the same or similar advantages, and the details are not repeated herein.

Embodiments provide an electrostatic discharge protection device. The electrostatic discharge protection device includes a first high-voltage P-type well region, a first high-voltage N-type well region, a second high-voltage P-type well region, and a second high-voltage N-type well region arranged side-by-side on the N-type deep well region. The low-voltage N-type well region is disposed on the first high-voltage P-type well region. The first P-type doped region, the second P-type doped region and the first N-type doped region are respectively disposed on the low-voltage N-type well region, the second high-voltage P-type well region and the second high-voltage N-type well region. And the gate structure is located between the first P-type doped region and the second P-type doped region. The first P-type doped region of the electrostatic discharge protection device is electrically connected to the first voltage source. Furthermore, the gate structure, the second P-type doped region and the first N-type doped region are electrically connected to the second voltage source. In some embodiments, the second high-voltage P-type well region, the N-type deep well region (may further include the first high-voltage N-type well region), the first high-voltage P-type well region, the low-voltage N-type well region and the first P-type doped region of the electrostatic discharge protection device may form a P-N-P-N-P junction. When an electrostatic discharge event occurs at the second voltage source and the first voltage source is grounded, the electrostatic charges may flow from the second voltage source, through the current path formed by the P-N-P-N-P junction provided by the electrostatic discharge protection device, and finally to the first voltage source. Therefore, the electrostatic charges may be discharged away from the circuit under protection. The electrostatic discharge protection device in accordance with some embodiments of the disclosure has the advantages of both the conventional PNP parasitic bipolar junction transistor and the parasitic silicon controlled rectifier (SCR), for example, non-snapback characteristic, low holding voltage $(V_{Hold})$, preventing latch-up occurring, etc.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device, comprising:

a P-type semiconductor substrate;

an N-type deep well region located in the P-type semiconductor substrate;

a first high-voltage P-type well region located on the N-type deep well region;

a first high-voltage N-type well region located on the N-type deep well region, wherein the first high-voltage N-type well region and the first high-voltage P-type well region are arranged side-by-side;

a second high-voltage P-type well region located on the N-type deep well region, wherein the second high-voltage P-type well region and the first high-voltage N-type well region are arranged side-by-side;

a second high-voltage N-type well region located on the N-type deep well region, wherein the second high-voltage N-type well region and the second high-voltage P-type well region are arranged side-by-side;

a low-voltage N-type well region located on the first high-voltage P-type well region;

a first P-type doped region located on the low-voltage N-type well region;

a second P-type doped region located on the second high-voltage P-type well region;

a first N-type doped region located on the second high-voltage N-type well region;

a gate structure disposed on the first high-voltage P-type well region, the first high-voltage N-type well region and the second high-voltage P-type well region, wherein the gate structure is located between the first P-type doped region and the second P-type well region; and a first silicide feature covering a portion of the first P-type doped region, wherein in a first direction that is substantially parallel to a top surface of the P-type semiconductor substrate, a first distance between the first silicide feature and the gate structure is greater than a second distance between the first P-type doped region and the gate structure, wherein the first P-type doped region is electrically connected to a first voltage source, wherein the gate structure, the second P-type doped region and the first N-type doped region are electrically connected to a second voltage source.

2. The electrostatic discharge protection device as claimed in claim 1, wherein the low-voltage N-type well region completely overlaps the first P-type doped region.

3. The electrostatic discharge protection device as claimed in claim 2, wherein the low-voltage N-type well region separates a bottom surface of the first P-type doped region from the first high-voltage P-type well region.

4. The electrostatic discharge protection device as claimed in claim 2, wherein a side surface of the low-voltage N-type well region away from the first high-voltage N-type well region is aligned with a boundary of the first high-voltage P-type well region away from the first N-type high-voltage well region.

5. The electrostatic discharge protection device as claimed in claim 4, wherein opposite sides of the low-voltage N-type well region are adjacent to the first high-voltage P-type well region.

6. The electrostatic discharge protection device as claimed in claim 4, wherein a bottom surface of the first P-type doped region is adjacent to the low-voltage N-type well region and the first high-voltage P-type well region.

7. The electrostatic discharge protection device as claimed in claim 4, wherein the first high-voltage P-type well region is simultaneously connected to the first P-type doped region, the low-voltage N-type well region and the first high-voltage N-type well region.

8. The electrostatic discharge protection device as claimed in claim 1, wherein the low-voltage N-type well region partially overlaps the first P-type doped region.

9. The electrostatic discharge protection device as claimed in claim 1, further comprising:

a first isolation feature disposed in the first high-voltage P-type well region and close to a first interface between the first high-voltage P-type well region and the first high-voltage N-type well region; and a second isolation feature disposed in the second high-voltage P-type well region and close to a second interface between the second high-voltage P-type well region and the first high-voltage N-type well region.

10. The electrostatic discharge protection device as claimed in claim 9, wherein the first high-voltage N-type well region is located between and separated from the first isolation feature and the second isolation feature along a first direction that is substantially parallel to a top surface of the P-type semiconductor substrate.

11. The electrostatic discharge protection device as claimed in claim 9, wherein the gate structure covers a portion of the first isolation feature and a portion of the second isolation feature.

12. The electrostatic discharge protection device as claimed in claim 9, wherein a first side surface of the first isolation feature away from the first interface is adjacent to the low-voltage N-type well region and the first P-type doped region, wherein a second side surface of the second isolation feature away from the second interface is adjacent to the second P-type doped region.

13. The electrostatic discharge protection device as claimed in claim 9, further comprising:

a third isolation feature disposed between the second high-voltage P-type well region and the second high-voltage N-type well region, wherein opposite side surfaces of the third isolation feature are respectively adjacent to the second P-type doped region and the first N-type doped region.

14. The electrostatic discharge protection device as claimed in claim 9, wherein the first silicide feature is separated from a first side surface of the first isolation feature away from the first interface.

15. The electrostatic discharge protection device as claimed in claim 9, wherein the first silicide feature covers a portion of the low-voltage N-type well region.

16. The electrostatic discharge protection device as claimed in claim 9, further comprising:

a second silicide feature covering the second P-type doped region;

a third silicide feature covering the first N-type doped region; and a fourth silicide feature covering the gate structure.

17. The electrostatic discharge protection device as claimed in claim 16, further comprising:

a first conductive line electrically connected to the first P-type doped region by the first silicide feature; and a second conductive line electrically connecting the second P-type doped region, the first N-type doped region and the gate structure by the second silicide feature, the third silicide feature and the fourth silicide feature.

18. The electrostatic discharge protection device as claimed in claim 1, wherein:

the first high-voltage P-type well region, the low-voltage N-type well region and the first P-type doped region form a first parasitic bipolar junction transistor, the low-voltage N-type well region, the first high-voltage P-type well region and the N-type deep well region form a second parasitic bipolar junction transistor, the second high-voltage P-type well region, the N-type deep well region and the first high-voltage P-type well region form a third parasitic bipolar junction transistor, a collector of the first parasitic bipolar junction transistor is electrically connected to the first voltage source, a base of the first parasitic bipolar junction transistor is electrically connected to an emitter of the second parasitic bipolar junction transistor, an emitter of the first parasitic bipolar junction transistor is electrically connected to a base of the second parasitic bipolar junction transistor, the base of the second parasitic bipolar junction transistor is electrically connected to a collector of the third parasitic bipolar junction transistor, a collector of the second parasitic bipolar junction transistor is electrically connected to a base of the third parasitic bipolar junction transistor, an emitter of the third parasitic bipolar junction transistor and the base of the third parasitic bipolar junction transistor are electrically connected to the second voltage source.

19. The electrostatic discharge protection device as claimed in claim 18, wherein when an electrostatic discharge event occurs at the second voltage source and the first voltage source is grounded, the first parasitic bipolar junction transistor, the second parasitic bipolar junction transistor and the third parasitic bipolar junction transistor are triggered to ON.

* * * * *